US012784171B2

(12) United States Patent
Pai et al.

(10) Patent No.: US 12,784,171 B2
(45) Date of Patent: Nov. 3, 2026

(54) METHOD AND DEVICE WITH OPERATION MODE DEPENDENT DEFECT DETECTION

(71) Applicant: Samsung Electronics Co., Ltd., Suwon-si (KR)

(72) Inventors: Priyadarshini Panemangalore Pai, Bengaluru (IN); Prashant Pandurang Shinde, Bengaluru (IN); Shashishekara Parampalli Adiga, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 972 days.

(21) Appl. No.: 17/886,946

(22) Filed: Aug. 12, 2022

(65) Prior Publication Data

US 2023/0054119 A1 Feb. 23, 2023

(30) Foreign Application Priority Data

Aug. 17, 2021 (IN) ............................. 202141037350
Mar. 14, 2022 (IN) ............................ 2021 41037350
May 30, 2022 (KR) ........................ 10-2022-0066098

(51) Int. Cl.
*G06T 7/00* (2017.01)
*G06T 7/60* (2017.01)
*H10P 74/20* (2026.01)

(52) U.S. Cl.
CPC ............ *G06T 7/0004* (2013.01); *G06T 7/001* (2013.01); *G06T 7/60* (2013.01); *H10P 74/203* (2026.01);

(Continued)

(58) Field of Classification Search
CPC ........... G06T 7/001; G06T 2207/20081; G06T 2207/20092; G06T 2207/30148;

(Continued)

(56) References Cited

U.S. PATENT DOCUMENTS 6,928,185 B2 * 8/2005 Yonezawa ........ G01N 21/95607 382/206
10,699,926 B2 6/2020 Plihal et al.

(Continued)

FOREIGN PATENT DOCUMENTS

KR 10-2019-0138434 A 12/2019

OTHER PUBLICATIONS

Wang, Junliang, et al. "Deformable convolutional networks for efficient mixed-type wafer defect pattern recognition." *IEEE Transactions on Semiconductor Manufacturing* vol. 33. Issue 4 (2020). pp. 587-596.

(Continued)

*Primary Examiner* — Michael P LaPage
(74) *Attorney, Agent, or Firm* — NSIP Law

(57) ABSTRACT

A method and device with defect detection are included. In one general aspect, a method performed by an electronic device includes determining, by the electronic device, an operation mode among different operation modes, wherein the electronic device is configured to implement the operation modes for determining wafer defects by processing semiconductor wafer images, and determining, by the electronic device, based on an indication of the determined operation mode, whether a semiconductor image, among the semiconductor wafer images, is defective.

24 Claims, 10 Drawing Sheets

(52) U.S. Cl.
CPC ............... *G06T 2207/20081* (2013.01); *G06T 2207/20092* (2013.01); *G06T 2207/30148* (2013.01); *G06T 2207/30168* (2013.01)

(58) Field of Classification Search
CPC . G06T 2207/30168; G06T 2207/10061; G06T 2207/20084; G06T 7/0004; G06T 7/60; H01L 22/12; G06F 18/2413
See application file for complete search history.

(56) References Cited

U.S. PATENT DOCUMENTS

| | | | | |
|---|---|---|---|---|
| 10,922,807 | B2 | 2/2021 | Moioli et al. | |
| 2010/0188486 | A1* | 7/2010 | Amanullah | G01N 21/8806 348/48 |
| 2014/0307946 | A1* | 10/2014 | Nakahira | G03F 7/7065 382/149 |
| 2016/0140412 | A1 | 5/2016 | Kolchin et al. | |
| 2016/0163035 | A1* | 6/2016 | Chang | G06N 3/045 382/149 |
| 2018/0053295 | A1* | 2/2018 | Ryu | G06T 7/0004 |
| 2018/0173839 | A1 | 6/2018 | Fang et al. | |
| 2018/0293722 | A1* | 10/2018 | Crocco | G06V 10/82 |
| 2019/0287015 | A1 | 9/2019 | Plihal | |
| 2019/0370661 | A1* | 12/2019 | Kwon | G06V 10/454 |
| 2020/0020092 | A1* | 1/2020 | Fang | G06T 7/001 |
| 2020/0151862 | A1* | 5/2020 | Ha | G06T 3/40 |
| 2021/0042906 | A1* | 2/2021 | Bean | G06T 7/0004 |
| 2022/0044383 | A1* | 2/2022 | Koshihara | G06V 10/454 |
| 2022/0044389 | A1* | 2/2022 | Xu | G06N 3/084 |
| 2022/0215521 | A1* | 7/2022 | Lee | G06F 3/04847 |
| 2022/0309764 | A1* | 9/2022 | Liu | G06N 3/042 |
| 2022/0383473 | A1* | 12/2022 | Chen | G06T 7/001 |
| 2023/0410285 | A1* | 12/2023 | Okuno | G06T 7/001 |
| 2024/0385121 | A1* | 11/2024 | Bakhshmand | G06T 7/001 |

OTHER PUBLICATIONS

Kim, Tae San, et al. "Novel method for detection of mixed-type defect patterns in wafer maps based on a single shot detector algorithm." *Journal of Intelligent Manufacturing* (2021). pp. 1-10.

* cited by examiner

METHOD AND DEVICE WITH OPERATION MODE DEPENDENT DEFECT DETECTION

CROSS-REFERENCE TO RELATED APPLICATIONS

This application claims the benefit under 35 USC § 119(a) of Indian Provisional Application No. 202141037350 filed on Aug. 17, 2021, and Indian Patent Application number 202141037350 filed on Mar. 14, 2022, in the Indian Patent Office, and Korean Patent Application No. 10-2022-0066098 filed on May 30, 2022, in the Korean Intellectual Property Office, the entire disclosures of which are incorporated herein by reference for all purposes.

BACKGROUND

1. Field

The following description relates to a method and device with defect detection.

2. Description of Related Art

Various visible and invisible defects may occur during a semiconductor manufacturing process, e.g., at the wafer production stage. Defective wafers, which typically need to be discarded, result in lost production time and lost resources.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method performed by an electronic device includes determining, by the electronic device, an operation mode among different operation modes, wherein the electronic device is configured to implement the operation modes for determining wafer defects by processing semiconductor wafer images, and determining, by the electronic device, based on an indication of the determined operation mode, whether a semiconductor image, among the semiconductor wafer images, is defective.

The determining whether the semiconductor wafer image is defective may include predicting a wafer defect in the semiconductor wafer image by using a defect prediction model, and training the defect prediction model with training data, the defect prediction model may be trained to predict multiple types of wafer defects, and the predicted defect may be one of the types of wafer defects.

The training data may include data of each of the defect types.

The semiconductor wafer images may have a same preset size, and the method further may include, according to the indication of the operation mode, when an image quality of one of the semiconductor wafer images may be determined to not satisfy a preset image quality standard, restoring the one of the semiconductor wafer images, and determining whether the restored one of the semiconductor wafer images may be defective using the defect prediction model.

The semiconductor wafer images may have various sizes, and the method further may include, according to the indication of the operation mode, determining to accept one of the semiconductor wafer images based on an aspect ratio and pixel range of the one of the semiconductor wafer images, adjusting a size of the accepted one of the semiconductor wafer images, and determining whether the resized accepted one of the semiconductor wafer images may be defective using the defect prediction model.

The size may be determined according to a user input.

The semiconductor wafer images may have various sizes, and the method further may include, according to the indication of the operation mode receiving a user-set size from a user, determining whether one of the semiconductor wafer images satisfies an input image size requirement of the defect prediction model, based on determining that the semiconductor wafer image does not satisfy the input image size requirement, resizing the one of the semiconductor wafer images to satisfy the input image size requirement, in response to the determining that an ROI of the semiconductor wafer image may be not in a predefined range, performing a first restoration operation on the one of the semiconductor wafer images, based on determining that a quality of the semiconductor wafer image does not satisfy a predefined standard, performing a second restoration operation on the one of the semiconductor wafer images, and after performing the resizing, the first restoration operation, and the second restoration operation, determining whether the one of the semiconductor wafer images may be defective by using the defect prediction model.

The first restoration operation may include transforming the one of the semiconductor images such that the ROI may be in the predefined range, and the second restoration operation may include increasing the quality of the semiconductor wafer image such that the quality of the semiconductor wafer image satisfies the predefined standard.

The defect prediction model may determine whether the semiconductor wafer image is defective based on at least one of a scene graph of the semiconductor wafer image, temperature information related to the semiconductor wafer image, noise information on the semiconductor wafer image, or sensor data related to the semiconductor wafer image.

The instructions may be further may be configured to further configure the processor to, based on the determined operation mode, prevent determining whether one of the semiconductor wafer images may be defective based on at least one of an aspect ratio of the one of the semiconductor wafer images, a size of the one of the semiconductor wafer images, a quality of the one of the semiconductor wafer images, and lack of a region of interest (ROI) of the one of the semiconductor wafer images.

The instructions may be further may be configured to further configure the processor to, according to the determined operation mode, determine whether the semiconductor wafer image may be defective by using a defect prediction model.

The instructions may be further configured to further configure the processor to train the defect prediction model to predict types of wafer defects, and predict one of the wafer defect types for the semiconductor wafer image.

The received semiconductor wafer images may all have a same preset size, and the instructions may be further configured to further configure the processor to, when a quality of one of the semiconductor wafer images does not satisfy a preset quality standard, restore the semiconductor wafer image, and identify a defect in the restored one of the semiconductor wafer images using the defect prediction model.

The received semiconductor wafer images may have various sizes, and the instructions may be further configured to further configure the processor to determine, based on an aspect ratio and pixel range of the semiconductor wafer image, whether to accept the semiconductor wafer image for performing the identifying of the defect, and adjust a size of the accepted semiconductor wafer image before performing the identifying of the defect.

The received semiconductor wafer images may have various sizes, and the instructions may be further configured to further configure the processor to receive a user-set size, determine, based on an aspect ratio and pixel range of the semiconductor wafer image, whether to accept the semiconductor wafer image for performing the identifying of the defect, and adjust a size of the accepted semiconductor wafer image to the user-set size before performing the identifying of the defect.

The received semiconductor wafer images may have various sizes, and the instructions may be further configured to further configure the processor to receive a user-set size, based on determining that the semiconductor wafer image does not satisfy an input image size requirement of the defect prediction model, adjust a size of the semiconductor wafer image such that the size of the semiconductor wafer image satisfies the input image size requirement, based on determining that an ROI of the semiconductor wafer image may be not in a predefined range, perform a first restoration operation on the semiconductor wafer image, based on determining that a quality of the semiconductor wafer image does not satisfy a predefined standard, perform a second restoration operation on the semiconductor wafer image, and perform the identifying of the defect in the semiconductor wafer image after adjusting the size and after performing the first and second restorations.

The first restoration operation may move the ROI of the semiconductor wafer image such that the ROI of the semiconductor wafer image may be in the predefined range, and the second restoration operation may increase the quality of the semiconductor wafer image such that the quality of the semiconductor wafer image satisfies the predefined standard.

The defect prediction model may identify the defect in the semiconductor wafer image based on at least one of a scene graph of the semiconductor wafer image, temperature information related to the semiconductor wafer image, noise information on the semiconductor wafer image, and sensor data related to the semiconductor wafer image.

The instructions may be further configured to further configure the processor to determine the operation mode based on evaluating whether the semiconductor wafer images have a same preset size, whether the semiconductor wafer images have sizes different from a user-set size, and whether the semiconductor wafer images have varying sizes.

In one general aspect, a method is performed by an electronic device, the method includes evaluating a first image feature of images of respective semiconductor wafers against a rejection condition and based thereon rejecting some of the images, evaluating a second image feature of the non-rejected images against an image quality condition and based thereon transforming some of the non-rejected images to cause the second image feature of the some of the non-rejected images to comply with the image quality condition, and providing each of the transformed non-rejected images and the non-transformed non-rejected images to a machine learning model that outputs wafer defect predictions for each of the respective non-rejected images and non-transformed non-rejected images.

The first image feature may include a size and a dimension ratio and the rejection condition may include a threshold size and a threshold dimension ratio.

The first image feature and/or the second image feature may include sharpness, noise, contrast, color accuracy, distortion, and/or blur.

The second image feature may include an ROI corresponding to a wafer die.

The defect predictions may include respective indications of types of wafer defects.

The rejection condition and the image quality condition may be determined based on a selectable operating mode.

The operating mode may be selected from among available operating modes based on a user input or a feature of the images.

The machine learning model may be a trained neural network.

The method may further include selecting the machine learning model from among machine learning models for identifying images of defective semiconductor wafers.

The method further may further include moving a wafer based on a wafer defect prediction.

BRIEF DESCRIPTION OF THE DRAWINGS

Hereinafter, examples will be described in detail with reference to the accompanying drawings. When describing the examples with reference to the accompanying drawings, like reference numerals may refer to like components and a repeated description related like reference numerals may be omitted.

DETAILED DESCRIPTION

Figure 1:
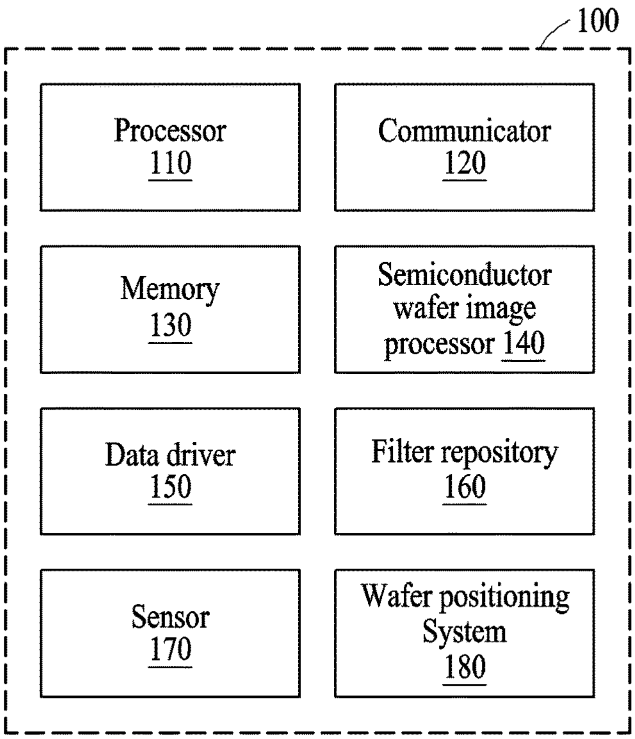
FIG. 1 illustrates an example of a configuration of an electronic device for identifying a defect in a semiconductor wafer, according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

Artificial intelligence (AI) monitoring/inspection may be used to reduce semiconductor manufacturing losses due to defective wafers, for example. AI monitoring and inspection may also be used to improve quality and yield. Although effective defect detection models may exist and be used, defect prediction may benefit from techniques for selecting appropriate models. Existing labeled training defect data can be highly unbalanced, which may have a negative impact on the training of machine learning (ML) classifiers, such as deep learning (DL) classifiers, as a non-limiting example. In addition, many images of semiconductors that are actually defective may not be classified as such by a trained ML classifier due to inherent insufficiencies of an image preprocessing stage as well as a defect prediction model. A typical real-time application may still need manual intervention for operationally effective defect prediction. Improving models alone may not be adequate for sufficient defect detection or classification. Typically, in a production-time application program, when heterogeneous image data is inputted to a real-time application program (e.g., a trained classifier), image selection, preprocessing, validation, and prediction may involve complex user choices that hinder overall performance. Inappropriate user-selection of input data (or pre-processing applied thereto) and/or a model may not produce reliable prediction results.

Examples described herein may relate to methods of identifying a defective semiconductor wafer by detecting or identifying a defect in a corresponding semiconductor wafer image. Multiple and adaptive or dynamic operation modes may be used to provide a platform for identifying defective semiconductors or semiconductor wafers. Examples of the platform, and methods thereof, may be widely applicable to all types of wafers, processing, and equipment. An appropriate prediction model may be readily automatically or autonomously selected and/or applied while using various imaging techniques, such as metrology techniques.

Requirement-based defect inspection may be used to facilitate the use of a multi-model repository. The need for human intervention, e.g., to select images, models, etc., may be reduced or eliminated in multiple stages of a defect detection pipeline by, for example, using a knowledge-guided filter together with selectable interpolation and restoration modules. Wafer images in different sizes and qualities may be used in a same prediction pipeline. Various workflow tasks may be used for image quality verification and/or data augmentation.

Methods described herein may be used to generate high-quality defect data from an input image. Training data sets having imbalances in modeling and/or analysis may be improved. Some of the methods may be used for reliable large-scale defect detection performed on unlabeled semiconductor wafer images. Some of the methods may be used to perform image selection, find a region of interest (ROI), process various inputs, select and/or assign a model for multi-stage defect detection.

By providing a platform (implemented on an electronic device) with different operation modes, for example, a user of the platform may receive recommendations for wafer inspection, for example based on requirements, or may determine a selection parameter. Methods and platforms may be used for semiconductor inspection during production thereof. In addition, methods and platforms may be applied or extended to metrology techniques, such as a critical dimension scanning electron microscope (CD-SEM), critical dimension (CD) optical, transmission electron microscopy (TEM), and the like.

Methods and platforms may be used to obtain high-quality wafer defect data by using an observation and knowledge-guided filter, which may be available in multiple operation modes, for artificial intelligence (AI)-based semiconductor wafer image inspection. High-quality wafer defect data may be obtained from an image by using input-based recommendations. An aspect ratio may be used as a parameter to discard undesirable semiconductor wafer images. Some implementations may use data derived from a domain expert-designed filter for screening images, and the domain expert-designed filter may be based on a range observed in the quantity of defective and normal dies on a wafer map.

Some examples may reduce the need for repeated image capturing, which is time consuming and computationally expensive. A semiconductor wafer image may be processed with high accuracy and in a fast and cost-efficient way. In some implementations, it may not be necessary to indiscriminately provide all images to a prediction model, that is to say, undesirable images may be removed, which may help ensure model accuracy with minimal manual intervention.

Some implementations may perform customized semiconductor wafer defect analysis based on requirements guided by user input.

Some implementations may use an Adam optimizer to ensure balanced training. In some implementations, a first knowledge-guided filter may remove an undesirable image from a prediction workflow, and a second knowledge-guided filter may ensure that an image has a desirable ROI (e.g., an ROI corresponding to a die). The techniques described herein may be used to process types of images other than semiconductor images.

Methods and electronic devices (platforms) for identifying defects in semiconductor wafers via images thereof, for example, are described in detail with reference to FIGS. 1 through 10. FIG. 1 illustrates an example of a configuration of an electronic device for identifying a defect in a semiconductor wafer, according to one or more embodiments. Referring to FIG. 1, an electronic device 100 may include, or be included in, for example, a laptop, a desktop computer, a notebook computer, a smartphone, a foldable phone, a smart TV, a tablet, an immersive device, an Internet of Things (IoT) device, a supercomputer, a cloud resource, a virtual machine, a server, a compute cluster, a wafer processing system, combinations thereof, etc.

The electronic device 100 may include a processor 110, a communicator 120, a memory 130, a semiconductor wafer image processor 140, a data driver 150, and a filter repository 160 (e.g., a memory). In some implementations, the electronic device 100 includes one or more sensors 170, e.g., one or more image sensors and/or cameras, as non-limiting examples (some examples are noted above). In an example, the electronic device may include a wafer positioning system 180, e.g., for image capture and/or obtainment or for the discarding of determined defective semiconductor wafers, and/or for the discarding of semiconductor wafers determined to be defective. The wafer positioning system 180 may be configured according to typical wafer movement and positioning systems.

The processor 110 may be connected with the communicator 120, the memory 130, the semiconductor wafer image processor 140, the data driver 150, and the filter repository 160. The processor 110 may be configured to execute instructions stored in the memory 130 and perform various processes. The processor 110 may include one or a plurality of processors. The one or the plurality of processors may be a general-purpose processor, such as a central processing unit (CPU), an application processor (AP), a graphics-only processing unit such as a graphics processing unit (GPU), a visual processing unit (VPU), an AI processor, such as a neural processing unit (NPU), a neuromorphic processor, and/or combinations thereof, etc. As used hereafter, "processor" refers to any one or more processors.

The processor may control the processing of input data based on a predefined operation rule or AI model stored in a non-volatile memory and/or a volatile memory. The predefined operation rule or AI model may be a machine learning model, e.g., provided through supervised, unsupervised, or reinforcement training or learning. Here, "predefined" refers to a trained/learned state of the operation rule or AI model.

The predefined operation rule or AI model may be generated for a trained/learned purpose and/or to have a desired feature by applying a learning algorithm to pieces of training data having features (e.g., labels) related to image data. The generating and training may be performed by a device having an AI function (e.g., instructions implementing a learning algorithm) and/or may be implemented through a separate server/system.

In some implementations, the AI model may include neural network layers as an example machine learning model. Each layer may have a plurality of learned weight values and may perform a layer operation through an operation result of a previous layer and a plurality of weight operations applied to the results of a previous layer or the same layer at a previous and/or subsequent time. The neural network may be, for example, a convolutional neural network (CNN), a deep neural network (DNN), a recurrent neural network (RNN), a restricted Boltzmann machine (RBM), a deep belief neural network (DBN), a bidirectional recurrent deep neural network (BRDNN), a generative adversarial network (GAN), a deep Q-network, or the like.

The learning algorithm may be a method of causing, allowing, or controlling a target device to perform an inferential determination or prediction by training a predetermined model that is to be used by a target device (e.g., a robot). The training may be performed by using pieces of training data. The learning algorithm may be, for example, a supervised learning algorithm, an unsupervised learning algorithm, a semi-supervised learning algorithm, a reinforcement learning (RL) algorithm, for example, however, the examples are not limited thereto.

The communicator 120 may be configured to communicate internally between internal hardware components (e.g., a bus) or with external devices (e.g., a network interface card) through one or more networks.

The memory 130 may store various applications, e.g., a virtual assistance application, a voice assistance application, etc. The memory 130 may also store instructions to be executed by the processor 110 to perform methods and processes described herein. The instructions may be in the form of compiled processor-executable machine code, intermediate code, bytecode, source code, declarative code, and/or the like.

The memory 130 may include volatile and/or non-volatile storage elements. Examples of non-volatile storage elements may be a magnetic hard disc, an optical disc, a floppy disc, flash memory, electrically programmable memory (EPROM), or electrically erasable and programmable memory (EEPROM). Examples of volatile storage elements are random access memory (RAM), dynamic RAM (DRAM) of various types, etc. The memory 130 may be provided as a non-transitory storage medium, which may be any of the foregoing examples or combinations thereof, excluding signals per se.

Figure 2:
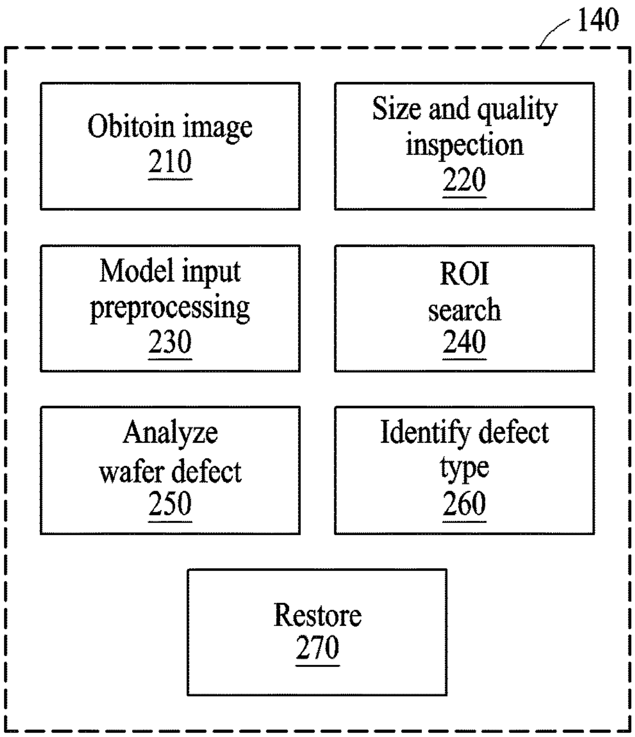
FIG. 2 illustrates an example of a configuration of a semiconductor wafer image processor included in an electronic device, according to one or more embodiments.

The semiconductor wafer image processor 140 may be implemented as one or more portions of instructions, such as in instruction portions (in any combination or as a whole) representable by the semiconductor wafer image processor 140 of FIG. 2, as a non-limiting example. The semiconductor wafer image processor 140 may receive a plurality of semiconductor wafer images, which may have different sizes (e.g., dimension sizes) and/or image qualities. The semiconductor wafer image processor 140 may determine an operation mode (e.g., a target operation mode) among various available operation modes (e.g., candidate operation modes). Based on the determined operation mode, the electronic device 100 may process the plurality of semiconductor wafer images to determine that a semiconductor wafer image is defective, i.e., corresponds to a defective semiconductor wafer. In some examples, a defect may be identified in the semiconductor wafer image. In an example, the semiconductor wafer determined to be defective may be discarded, e.g., by the wafer positioning system 180.

In addition, in some examples, the semiconductor wafer image processor 140, when receiving semiconductor wafer images, before determining an operation mode, may verify the semiconductor wafer images against one or more discarding conditions and may discard any of the received semiconductor wafer images that satisfy a discarding condition. The wafer image processor 140 may verify whether a semiconductor wafer image satisfies a discarding condition by using one or more filters included in the filter repository 160. Whether a semiconductor wafer image satisfies a discarding condition may be determined, based on, for example, an aspect ratio of the semiconductor wafer image, a size of the semiconductor wafer image, a quality of the semiconductor wafer image (e.g., resolution, blur metric, color, contrast, etc.), a lack of an ROI (or an adequate ROI) of the semiconductor wafer image, or any other data associated with, or computed based on, the semiconductor wafer image. In an example, the sensor 170 may capture or measure one or more such pieces of information.

An aspect ratio discarding condition may be, for example, when an aspect ratio is less than a certain ratio which may correspond to whether a semiconductor wafer image is restorable (i.e., transformable to a suitable state). When a semiconductor wafer image has too high of an aspect ratio it may be desirable to discard the semiconductor wafer image, for example because it cannot be restored (transformed) to a suitable aspect ratio. For example, a 1:1 ratio may be called for, and an image with 3:4 ratio, for example, may be adequately restorable to the 1:1 ratio, however, a severe ratio, such as a 1:20 ratio, may not be adequately restorable to the 1:1 ratio. Thus, for example, the aspect ratio discarding condition may be that any image with less than a 1:2 aspect ratio is discarded. Which range of aspect ratios may be adequately restorable to a target aspect ratio may depend on practical experience with particular implementations, may be learned using machine learning techniques, etc.

A size discarding condition may require a certain minimum size of an image, and a semiconductor wafer image having a size that is not adequately restorable, according to the certain size, may satisfy the size discarding condition and may therefore be discarded (e.g., omitted from defect detection processing). The certain size (or size range) for adequate restoration may depend on practical experience with particular implementations, may be learned using machine learning techniques, etc.

A quality discarding condition may be used to discard semiconductor wafer images that are not practical or usable even after restoration. The quality discarding condition may include one or more thresholds for one or more respective image quality factors, such as sharpness, noise, contrast, color accuracy, distortion, blur, and/or the like. A quality discarding condition may be applied to semiconductor wafer images before and/or after restorations thereof. The one or more thresholds may be determined manually or by feedback-based machine learning, for example.

An ROI discarding condition may be satisfied by a semiconductor wafer image when the image lacks an ROI. That is, the ROI discarding condition may correspond to a lack of an ROI in a semiconductor wafer image, before and/or after restoration. Lack of an ROI may be an indication that an image is not sufficient to be restored. In some examples, an ROI may correspond to a die region.

Each of the above-mentioned specific discarding conditions, or others, may be configured as separate respective image filters or any combination of the discarding conditions may be combined into one filter.

Figure 9A:
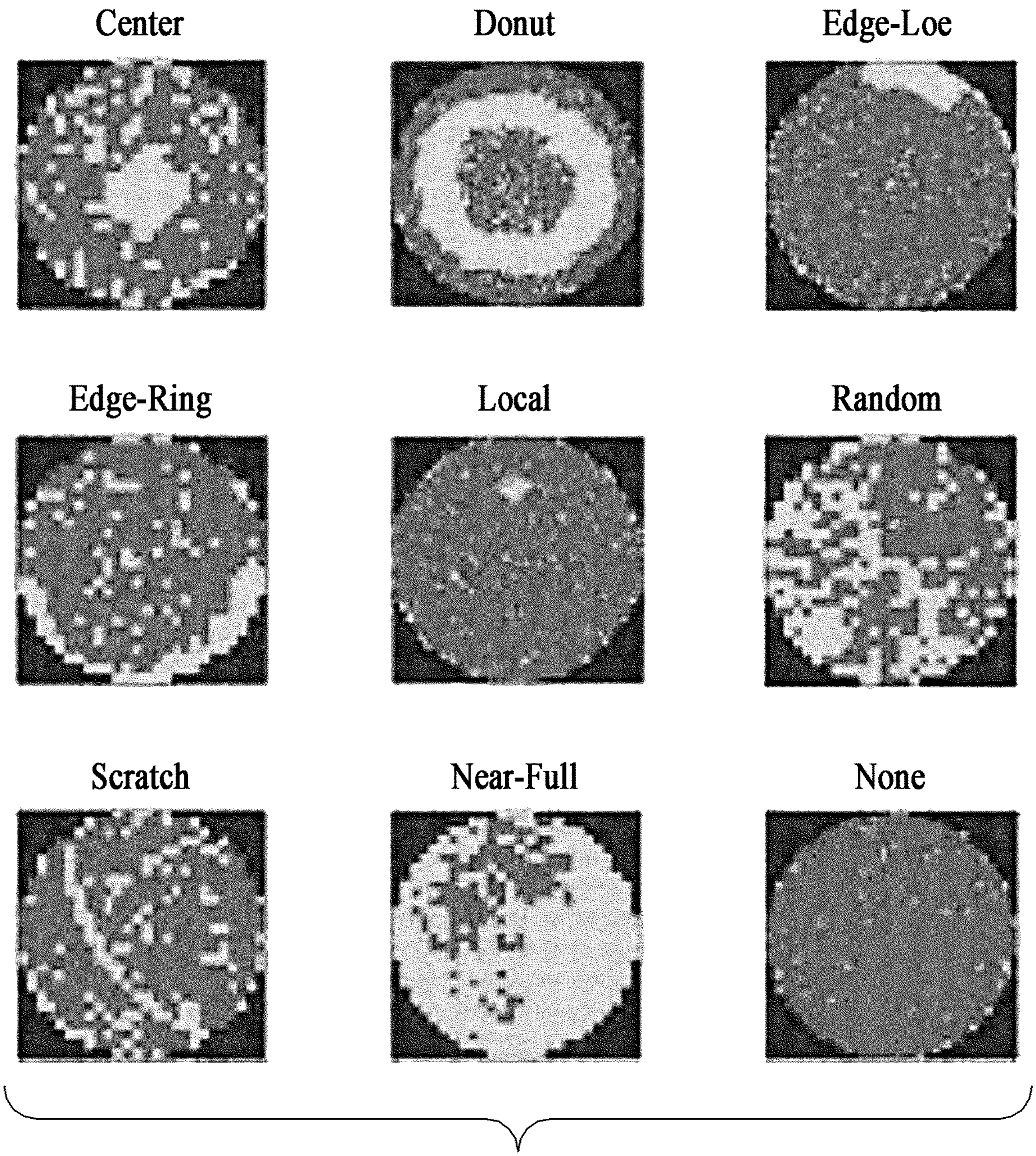
FIG. 9A illustrates an example of images suitable for defect detection in an electronic device, according to one or more embodiments.
Figure 9B:
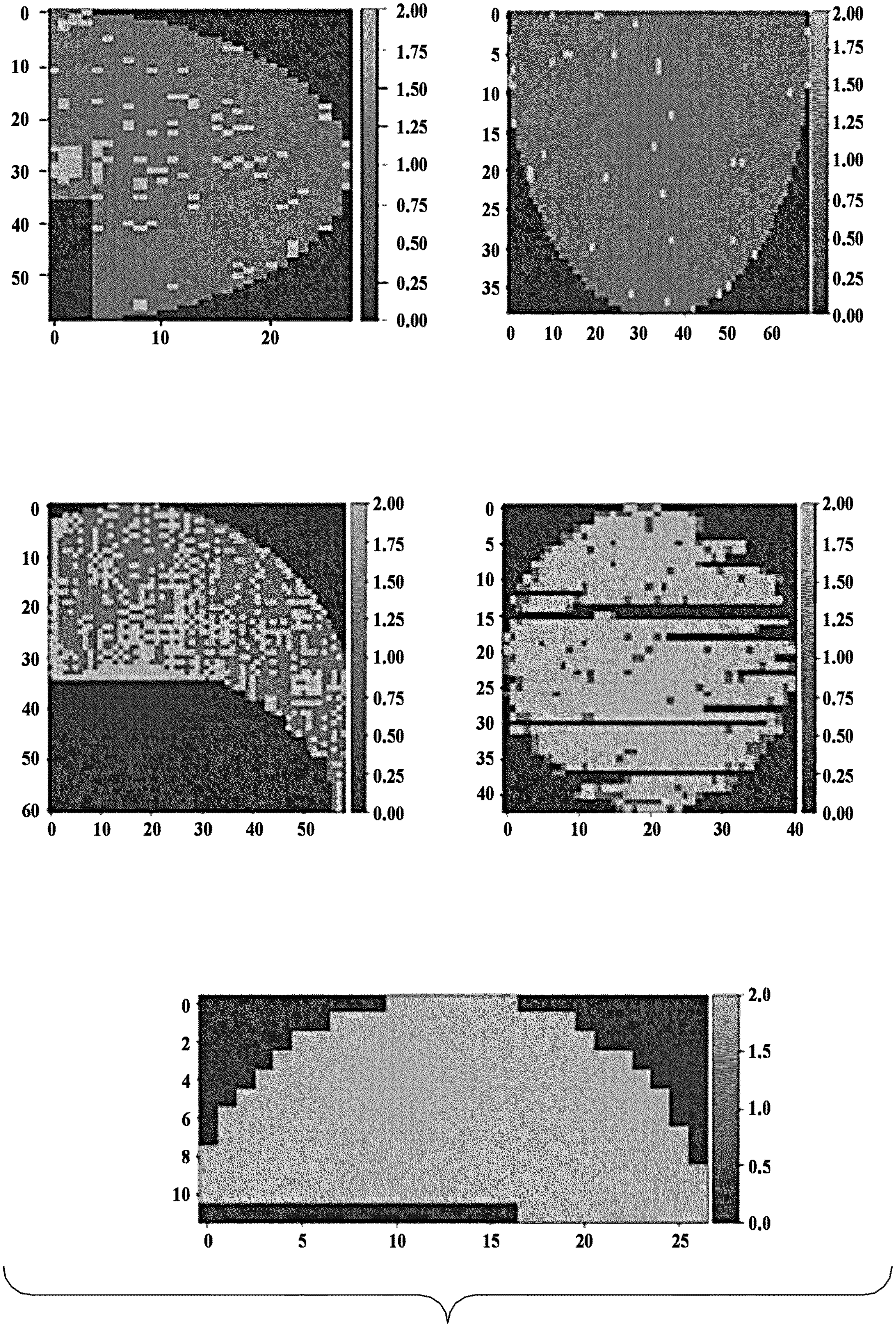
FIG. 9B illustrates an example of images satisfying size requirements but not suitable for defect detection in an electronic device, according to one or more embodiments.

Examples of semiconductor wafer images that do not satisfy a discarding condition and examples of semiconductor wafer images that do satisfy a discarding condition are discussed, respectively, with reference to FIGS. 9A and 9B. Specifically, FIG. 9A illustrates examples of images suitable for defect detection in an electronic device, according to one or more embodiments, and FIG. 9B illustrates examples of images satisfying size requirements but not suitable for defect detection in an electronic device, according to one or more embodiments.

The filter repository 160 may include at least one filter for removing undesirable images from among candidate semiconductor wafer images and/or a filter for ensuring the that the candidate semiconductor wafer images include a desirable ROI. In addition, the filter repository 160 may include at least one filter for filtering the candidate semiconductor wafer images, based on factors such as the size of the candidate semiconductor wafer images, the quality of the candidate semiconductor wafer images, aspect ratios of the candidate semiconductor wafer images, and/or presence/detectability of ROIs of the candidate semiconductor wafer images. At least one filter included in the filter repository 160 may be referred to as a knowledge-guided filter.

In addition, the semiconductor wafer image processor 140 may be configured to include operation modes, which may include, for example, a standard operation mode, an advanced operation mode, a user-set operation mode, and/or an adaptive operation mode.

The semiconductor wafer image processor 140 may automatically determine the operation mode to be the standard operation mode in response to a determination that the received candidate semiconductor wafer images are in (or sufficiently within) the same preset size. The semiconductor wafer image processor 140 may automatically determine the operation mode to be the user-set operation mode or the adaptive operation mode in response to a determination that the received semiconductor wafer images have sizes different from a predetermined size, which may be a user setting, a default setting, a learned setting, etc. The semiconductor wafer image processor 140 may determine the operation mode to be the advanced operation mode in response to a determination that the received candidate semiconductor wafer images have variable sizes. Other types of operation modes may be provided. For example, a variable operation mode may be provided that may allow the semiconductor wafer image processor 140 to dynamically switch between operation modes when processing a batch of candidate semiconductor wafer images.

In some implementations, the semiconductor wafer image processor 140 may receive candidate semiconductor wafer images generally having a same preset size while operating in the standard operation mode. When an image quality of a candidate semiconductor wafer image does not satisfy a preset standard, the semiconductor wafer image processor 140 may perform restoration on the candidate semiconductor wafer image. The semiconductor wafer image processor 140 may then determine whether the restored semiconductor wafer image (and hence the semiconductor wafer) is defective by processing the restored semiconductor wafer image with a defect prediction model. In this case, the semiconductor wafer image processor 140 may verify whether image quality satisfies the preset standard by using at least one filter included in the filter repository 160.

In the advanced operation mode, the semiconductor wafer image processor 140 may receive candidate semiconductor wafer images in variable sizes, determine to accept a candidate semiconductor wafer image based on an aspect ratio and/or pixel size (e.g., horizontal and/or vertical dimension, pixel quantity, etc.) of the semiconductor wafer image, adjust the size of the accepted candidate semiconductor wafer image, and determine whether the semiconductor wafer image (and thus the corresponding semiconductor) is defective by processing the adjusted and accepted semiconductor wafer image with a defect prediction model.

In the user-set operation mode, the semiconductor wafer image processor 140*i* may receive a user-set size, receive candidate semiconductor wafer images in variable sizes, determine whether to accept a semiconductor wafer image based on an aspect ratio and/or pixel size of the semiconductor wafer image, adjust the size of the accepted candidate semiconductor wafer image to the user-set size, and determine whether the semiconductor wafer image (and thus the corresponding semiconductor) is defective by processing the adjusted accepted semiconductor wafer image with a defect prediction model.

In the adaptive operation mode, the semiconductor wafer image processor 140 may receive a user-set size from a user, receive candidate semiconductor wafer images in variable sizes, and determine whether a candidate semiconductor wafer image satisfies an input image size requirement of a defect prediction model. When a candidate semiconductor wafer image does not satisfy the input image size requirement, the semiconductor wafer image processor 140 may adjust the size of the candidate semiconductor wafer image to a size that satisfies the input image size requirement of the defect prediction model, identify an ROI of the semiconductor wafer image, determine whether a size of the ROI is within a predefined range, and in response to the determining that the size of the ROI is not within the predefined range, perform a first restoration operation on the candidate semiconductor wafer image and determine a quality of the semiconductor wafer image. When the quality of the candidate semiconductor wafer image does not satisfy a predefined quality standard, a second restoration operation may be performed on the candidate semiconductor wafer image, and it may be determines whether the twice-restored image (and thus the corresponding semiconductor wafer) is defective by processing the twice-restored semiconductor wafer image using a defect prediction model.

In this case, the first restoration operation may move the ROI of the semiconductor wafer image such that the ROI of the candidate semiconductor wafer image is within a predefined range, and the second restoration operation may increase a quality of the candidate semiconductor wafer image such that the quality of the candidate semiconductor wafer image satisfies the predefined standard. The type of quality (or qualities) tested and adjusted may be any one or more of the qualities described above.

In the adaptive operation mode, the defect prediction model may determine whether the candidate semiconductor wafer image is defective by further including, in addition to the candidate semiconductor wafer image, supplemental information, for example, a scene graph of the candidate semiconductor wafer image, temperature information related to the candidate semiconductor wafer image, noise information associated with the semiconductor wafer image, and/or sensor data associated with the semiconductor wafer image. Supplemental information of the candidate semiconductor wafer image may be any information related to the image that may bear on the ability of a defect prediction model to predict whether the candidate image is defective.

Moreover, the semiconductor wafer image processor 140 may be implemented by analog or digital circuits, such as logic gates, an integrated circuit, a microprocessor, a microcontroller, a memory circuit, a passive electronic component, an active electronic component, an optical component, a hardwired circuit, and/or the like, and may be driven by firmware, as the case may be.

The data driver 150 may receive training data which may include pieces of mixed defect-type data and associated semiconductor wafer training images. In some implementations, the training data may include training images and the pieces of mixed defect-type data may include indicia of defects (e.g., locations, regions, features, etc.) in the training images as well as corresponding labels of the types of the indicated defects. The data driver 150 may also receive additional data (e.g., the supplemental information noted above). The data driver may perform deep learning (DL) by using the training data to train a defect prediction model. The pieces of mixed defect-type data may be tailored for training by using balanced (e.g., sufficiently distributed) numbers of examples of the defect-types, for example. Such balanced training data may result, from the DL for example, in a precise defect prediction model. The additional data may be obtained to develop/analyze the defect prediction model, which may be generated as a result of the performed DL. In this case, the additional data may be used for developing/analyzing the defect prediction model, aside from the training data. The data driver 150 may be a machine learning (ML) model-based controller. That is, the data driver 150 may implement a machine/artificial learning algorithm that processes the training data to produce the trained defect prediction model. As described below, the defect prediction model may generate defect predictions for candidate semiconductor wafer images.

FIG. 2 illustrates an example of a configuration of a semiconductor wafer image processor 140 included in an electronic device, according to one or more embodiments. The semiconductor wafer image processor 140 may include functionality such as obtain image 210 function, size and quality inspection 220 function, model input preprocessing 230 function, ROI search 240 function, analyze wafer defect 250 function, identify defect type 260 function, and restore 270 function. While functionalities of the semiconductor wafer image processor 140 may be conveniently arranged with the configuration of components shown in FIG. 2, the configuration and arrangement of the components may vary with different implementations.

Although the semiconductor wafer image processor 140 may process a batch of many candidate semiconductor wafer images, operations of the semiconductor wafer image processor 140 of FIG. 2 are described with reference to a single candidate semiconductor wafer image, with the understanding that the operations may be repeated for each candidate image in the batch of candidate semiconductor wafer images.

With reference to FIG. 2, receiving an image may include receiving a location of an image, i.e., receiving an image refers to receiving a copy of an image or receiving a reference to an image (e.g., accessing an image according to a reference thereto).

The image obtain 210 functionality may receive a candidate semiconductor wafer image. The candidate image may be received via the communicator 120, for example.

The size and quality inspection 220 function may verify the size and/or quality of the received candidate semiconductor wafer image.

According to the verification of the size and quality inspection 220 function, the model input preprocessing 230 function may, if necessary, perform a size transformation on the candidate semiconductor wafer image by using nearest neighbor interpolation, for example. In some implementations, the candidate semiconductor wafer image may be down-scaled and/or up-scaled in either or both dimensions using known techniques.

The ROI search 240 function may receive the transformed candidate semiconductor wafer image verify that the candidate image is suitable by searching the candidate image for an ROI. The ROI search 240 function may determine whether an ROI feature of the candidate image meets a related condition. The related condition may include whether an ROI was found, whether an ROI includes a complete circular region (or a measure of circular completeness), a size of an ROI, a location of an ROI, etc. The search and analysis may be performed using image analysis techniques.

The analyze wafer defect 250 function may determine whether a semiconductor wafer image is defective. The analyze wafer defect 250 function may be, or may include, any of the defect prediction models described above. In some implementations, the analyze wafer defect 250 function may detect defects. For example, the analyze wafer defect 250 function may be configured to detect one or more types of wafer defects, for example a center defect, a donut defect, an edge-ring defect, an edge-location defect, a random defect, an unknown defect, a near-full defect, or the like. In some implementations, the analyze wafer defect 250 function may generate a defect-type identifier for respectively identified defects. In addition to identifying a type of corresponding defect, a defect-type identifier may include information about a location/region of the corresponding defect in the candidate image.

The identify defect 260 function may be configured according to one or more operation modes and may include one or more detectors, for example, a single-defect detector, a multiple-defect detector, a bounding box detector, a defect percentage detector, an ensemble detector, a hybrid defect detector, and/or a multi-mode input-based detector.

A single-defect detector may verify whether the candidate semiconductor wafer image includes a defect. A multiple-defect detector may detect one or more defects in the candidate image by using details of a defect type (e.g., an unknown defect, a single defect, a random defect, a center defect, a donut defect, an edge-ring defect, an edge-location defect, etc.). A bounding box detector may detect a position of a defect in one or more semiconductor wafer images and generate a bounding box containing the defect. A defect percentage detector may detect the intensity of a defect in one or more semiconductor wafer images (e.g., a predicted probability of a defect, a degree of defectiveness, etc.). An ensemble detector may perform defect detection by using one or more models and may use voting, for example, to reach a consensus decision. A hybrid defect detector may use a mixed architecture to detect a defect and may use one or more inputs of different types that are suitable to receive multiple inputs of different modalities.

The restore 270 function may generate a restored version of the image (e.g., improved quality) from the candidate semiconductor wafer image. The restored image may be used as described above, and may be generated using various techniques (e.g., a noise removing technique, a fuzzy-based filtering technique, deblurring, etc.). The restored image may be analyzed using a prediction model, e.g., a defect prediction model.

Figure 10:
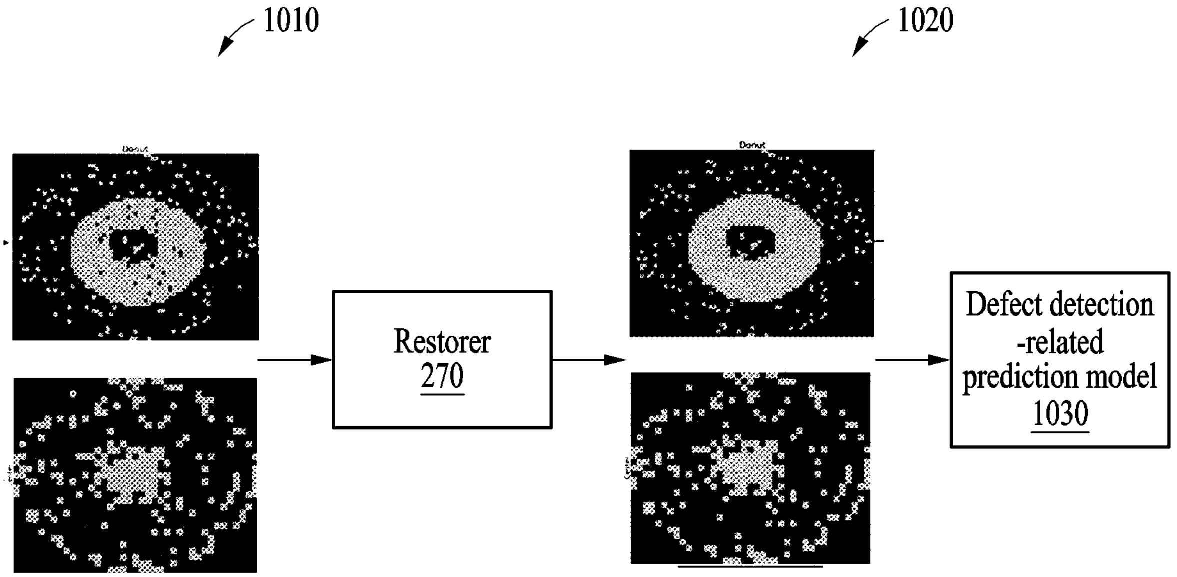
FIG. 10 illustrates an example of restoring quality of an image according to a standard operation mode in an electronic device, according to one or more embodiments.

FIG. 10 illustrates an example of restoring quality of an image according to a standard operation mode in an electronic device, according to one or more embodiments. Referring to FIG. 10, a semiconductor wafer image 1010 selected for restoration may be restored to a higher-quality semiconductor wafer image 1020 through the restore 270 function. Thereafter, the higher-quality restored semiconductor wafer image 1020 may be analyzed for defect detection through a defect prediction model.

Figure 3:
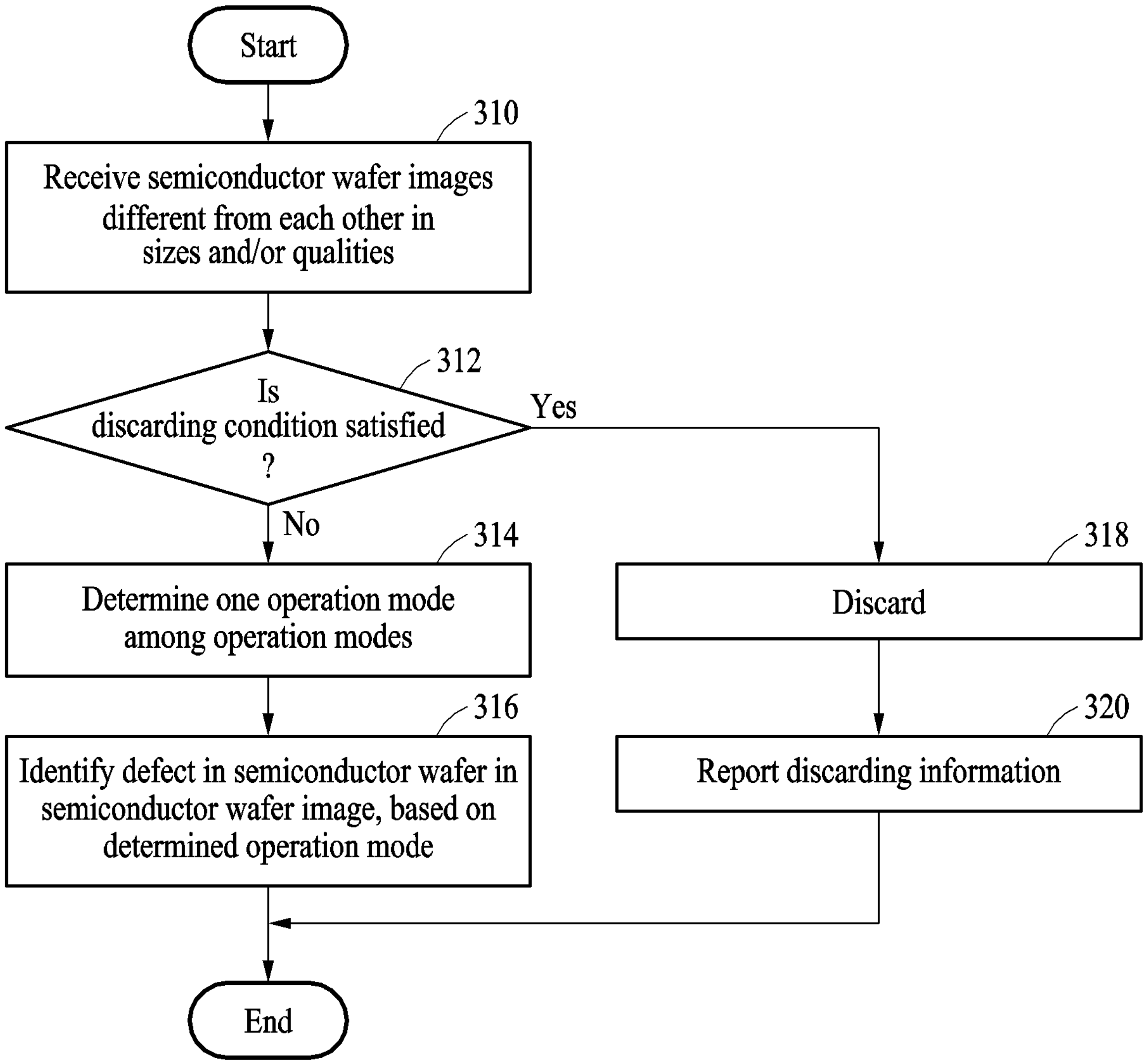
FIG. 3 illustrates an example of a process of identifying a defect in a semiconductor wafer in an electronic device, according to one or more embodiments.

FIG. 3 illustrates an example of a process of identifying a defect in a semiconductor wafer in an electronic device, according to one or more embodiments. In operation 310, the semiconductor wafer image processor 140 of the electronic device 100 may receive candidate semiconductor wafer images, which may have different sizes and/or quality. In operation 312, the semiconductor wafer image processor 140 may verify whether a candidate semiconductor wafer image satisfies a discarding condition. Operation 312 may involve, for example, determining whether the candidate semiconductor wafer image satisfies the discarding condition, based on, for example, an aspect ratio of the candidate image, the size of the candidate image, a quality of the candidate image, lack of an ROI (or a feature thereof) of the candidate image, or the like.

An aspect ratio discarding condition may be, for example, when an aspect ratio is less than a certain ratio which may correspond to whether a semiconductor wafer image is restorable. When a semiconductor wafer image has too high of an aspect ratio it may be desirable to discard the semiconductor wafer image, for example because it cannot be restored or transformed to a suitable aspect ratio. For example, a 1:1 ratio may be called for, and an image with 3:4 ratio, for example, may be adequately restorable to the 1:1 ratio, however, a severe ratio, such as a 1:20 ratio, may not be adequately restorable to the 1:1 ratio. Thus, for example, the aspect ratio discarding condition may be that any image with less than a 1:2 aspect ratio is discarded. Which range of aspect ratios may be adequately restorable to a target aspect ratio may depend on practical experience with particular implementations, may be learned using machine learning techniques, etc.

A size discarding condition may require a certain minimum size of an image, and a candidate semiconductor wafer image having a size that is not adequately restorable, according to the certain size, may satisfy the size discarding condition and may therefore be discarded. The certain size (or size range) for adequate restoration may depend on practical experience with particular implementations, may be learned using machine learning techniques, etc.

A quality discarding condition may be used to discard semiconductor wafer images that are not practical or usable even after restoration thereof. The image quality of the quality discarding condition may include one or more thresholds for one or more respective image quality factors, such as sharpness, noise, contrast, color accuracy, distortion, blur, and/or the like. A quality discarding condition may be applied to semiconductor wafer images before and/or after restorations thereof. The one or more thresholds may be determined manually or by feedback-based machine learning, for example.

An ROI discarding condition may be satisfied by a semiconductor wafer image when the image lacks an ROI, for example. That is, the ROI discarding condition may correspond to a lack of an ROI in a semiconductor wafer image, before and/or after restoration. Lack of an ROI may be an indication that an image is not sufficient to be restored.

The method of FIG. 3, for example, may use an image-knowledge filter (e.g., an aspect ratio filter), a summary of defective and normal dies, and the like, to select a high-quality semiconductor wafer image. Filters may be generated based on different optical modes for profile-based registration and defect detection. The filters may be configured based on a currently active operation mode. In some implementations, a candidate semiconductor wafer image may be removed when a noise level of the candidate semiconductor wafer image is not in an allowable range or is not adequately restorable.

When the candidate semiconductor wafer image satisfies the discarding condition after verification in operation 312, the semiconductor wafer image processor 140 may discard the semiconductor wafer image that satisfies the discarding condition in operation 318 and may provide discarding information related to the discarded semiconductor wafer image to a user in operation 320. The discarding information may include, for example, identification of the discarded image, one or more reasons for discarding the image, information about the discarded image, information about the corresponding semiconductor wafer, etc. Discarding may involve any operation that prevents the discarded image from being subjected to defect detection.

In operation 314, the semiconductor wafer image processor 140 may determine an operation mode from among a plurality of operation modes and based thereon my process a candidate semiconductor wafer image that has been determined to not satisfy the discarding condition (i.e., is accepted) according to the verification in operation 312.

In this case, the plurality of operation modes may include a standard operation mode, an advanced operation mode, a user-set operation mode, and an adaptive operation mode. In operation 314, the semiconductor wafer image processor 140 may determine the operation mode to be the standard operation mode in response to the received semiconductor wafer images being in the same preset size. Alternatively, in operation 314, the semiconductor wafer image processor 140 may determine the operation mode to be the user-set operation mode or the adaptive operation mode in response to the received candidate semiconductor wafer images being in sizes different from a user-set size. Alternatively, in operation 314, the semiconductor wafer image processor 140 may determine the operation mode to be the advanced operation mode in response to the received candidate semiconductor wafer images being in variable sizes.

In operation 316, the semiconductor wafer image processor 140 may identify a defect in a semiconductor wafer image (and therefore identify a corresponding semiconductor wafer as being defective) based on a determined operation mode of an electronic device. Specifically, in operation 316 the semiconductor wafer image processor 140 may identify a defect in the semiconductor wafer image by using a defect prediction model. In this case, in some implementations, the defect prediction model may be a model that may identify at least one piece of defect-type data related to the semiconductor wafer image. In addition, as described above, the defect prediction model may be trained by analyzing and learning a plurality of pieces of mixed defect-type data related to a plurality of semiconductor wafer images.

Figure 4:
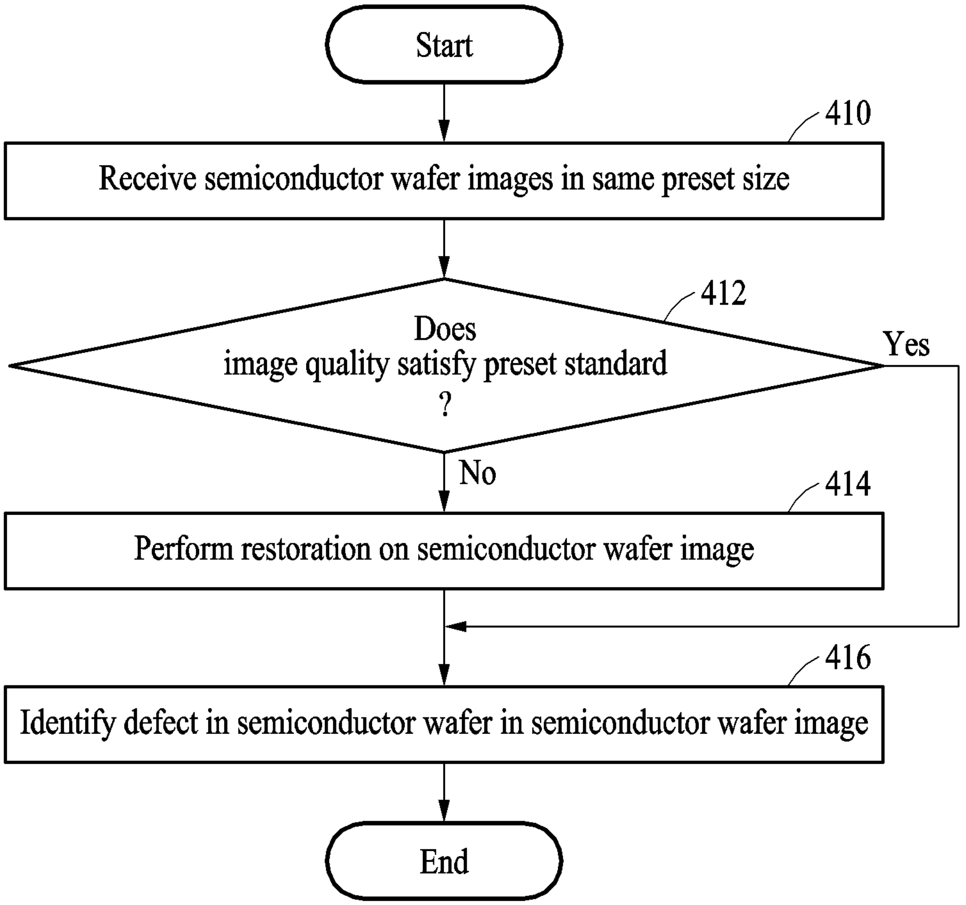
FIG. 4 illustrates an example of a process of identifying a defect in a semiconductor wafer according to a standard operation mode in an electronic device, according to one or more embodiments.

FIG. 4 illustrates an example of a process of identifying a defect in a semiconductor wafer according to a standard operation mode in an electronic device, according to one or more embodiments. In operation 410, the semiconductor wafer image processor 140 may receive semiconductor wafer images having the same preset size. The preset size may be, for example, a size of 52×52 pixels, which may be determined by an expert. An output and form of a semiconductor wafer image may also be preset by an expert. In some embodiments, the preset size may be set based on the current operation mode, e.g., the standard operation mode.

In operation 412, the semiconductor wafer image processor 140 may verify whether a quality of the semiconductor wafer image satisfies a preset standard. In this case, image quality may be assessed by measuring one or more image quality factors, such as sharpness, noise, contrast, color accuracy, distortion, blur, and the like. In some embodiments, the preset standard may be based on the operation mode, a user selection from among preset standards, etc.

When the quality of the semiconductor wafer image does not satisfy the preset standard after verification in operation 412, the semiconductor wafer image processor 140 may perform restoration on the semiconductor wafer image in operation 414. In this case, the image may be restored (transformed) by performing one or more image restoration methods, such as increasing sharpness, removing noise, adjusting contrast, adjusting distortion, removing blur, and the like.

When the quality of the semiconductor wafer image satisfies the preset standard according to the verification in operation 412 and is therefore not restored in operation 414, the original semiconductor wafer image is passed to the defect prediction model without restoration. Alternatively, when the semiconductor wafer image is restored in operation 414, the restored semiconductor image is passed to the defect prediction model. In either case, the semiconductor wafer image processor 140 uses the defect prediction model in operation 416 to determine whether the original or restored image is defective.

Figure 5:
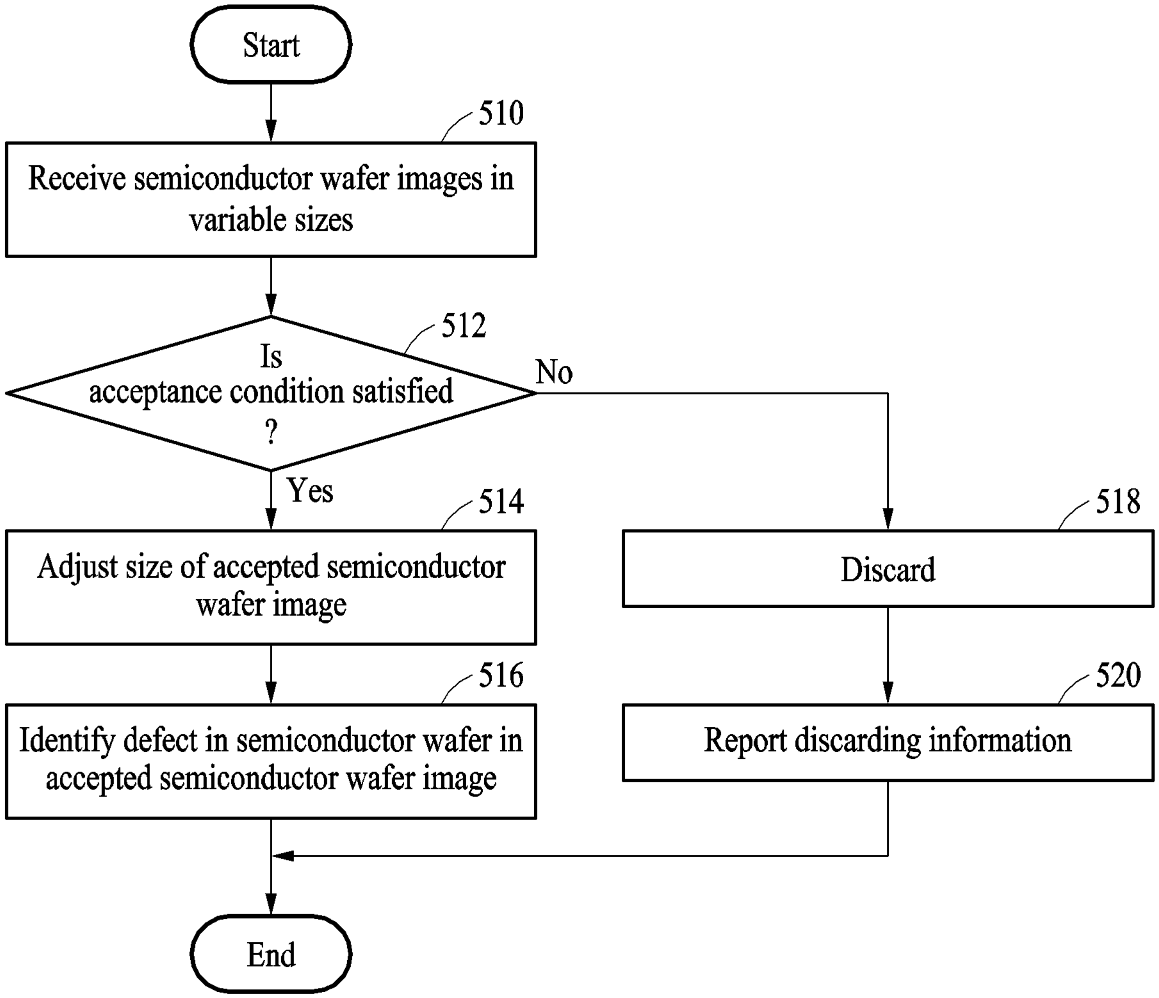
FIG. 5 illustrates an example of a process of identifying a defect in a semiconductor wafer according to an advanced operation mode in an electronic device, according to one or more embodiments.

FIG. 5 illustrates an example of a process of identifying a defect in a semiconductor wafer according to an advanced operation mode in an electronic device, according to one or more embodiments. In operation 510, the semiconductor wafer image processor 140 may receive semiconductor wafer images in variable sizes. In this case, some semiconductor wafer images may have, for example, a size of 52×52 pixels and some may have a size of 26×26 pixels.

Then, in operation 512, the semiconductor wafer image processor 140 may verify whether a semiconductor wafer image satisfies a condition for accepting a semiconductor wafer image. For example, an acceptance condition may be based on an aspect ratio and/or pixel range of the semiconductor wafer image. An acceptance condition of the aspect ratio may be that an aspect ratio is greater than a certain ratio and verifying the semiconductor wafer image may involve determining that the semiconductor wafer image is restorable and that the acceptance condition is satisfied. For example, when a 1:1 ratio is suitable and a 3:4 ratio or a 4:3 ratio is restorable to the 1:1 ratio, the 3:4 ratio or the 4:3 ratio may be acceptable, but a distorted ratio, such as a 1:20 ratio, may not be restorable and may thus be determined to be an unacceptable condition. Similarly, a pixel range may be acceptable when a product of multiplication of the number of horizontal and vertical pixels of the image is greater than or equal to a preset size, and may not be acceptable when the product of multiplication of the number of horizontal and vertical pixels of the image is less than the preset size.

Regarding operation 512, determining whether to accept a semiconductor wafer image based on both the aspect ratio and the pixel range may be helpful because in some cases determining whether a semiconductor wafer image is appropriate may not be practical using only one condition. For example, when an acceptance condition is that a pixel range is greater than or equal to 250 pixels, 50×50 pixels may satisfy the acceptance condition, but 1×250 pixels may also satisfy the acceptance condition. Accordingly, using an aspect ratio together with the pixel range as an acceptance condition may allow only a semiconductor wafer image having an appropriate aspect ratio to be accepted for defect detection.

Further regarding operation 512, when the semiconductor wafer image does not satisfy the acceptance condition according to the verification in operation 512, the semiconductor wafer image processor 140 may discard the semiconductor wafer image in operation 518. At the least, the discarding of operation 518 may involve diverting the discarded semiconductor wafer image so that it is not subjected to defect detection. After operation 518, operation 520 may be performed. Operation 520 may involve providing discarding information (information on the discarded semiconductor wafer image) to a user, a log, a rejection folder, etc. As noted above, discarding information may include any information related to the discarded image and/or the semiconductor wafer corresponding thereto, for example, information about why the image was discarded, the image itself, a pointer to a corresponding record in a table having records of semiconductor wafers, etc.

In operation 514, the semiconductor wafer image processor 140 may adjust the size of an accepted semiconductor wafer image that satisfies the acceptance condition to a preset size. In operation 514, the size of the accepted semiconductor wafer image may generally be adjusted using interpolation, for example; other techniques are known and may be used instead.

In operation 516, the semiconductor wafer image processor 140 may determine whether the semiconductor wafer image (and therefore the semiconductor wafer) is defective based on the accepted semiconductor wafer image by applying a defect prediction model to the semiconductor wafer image.

Figure 6:
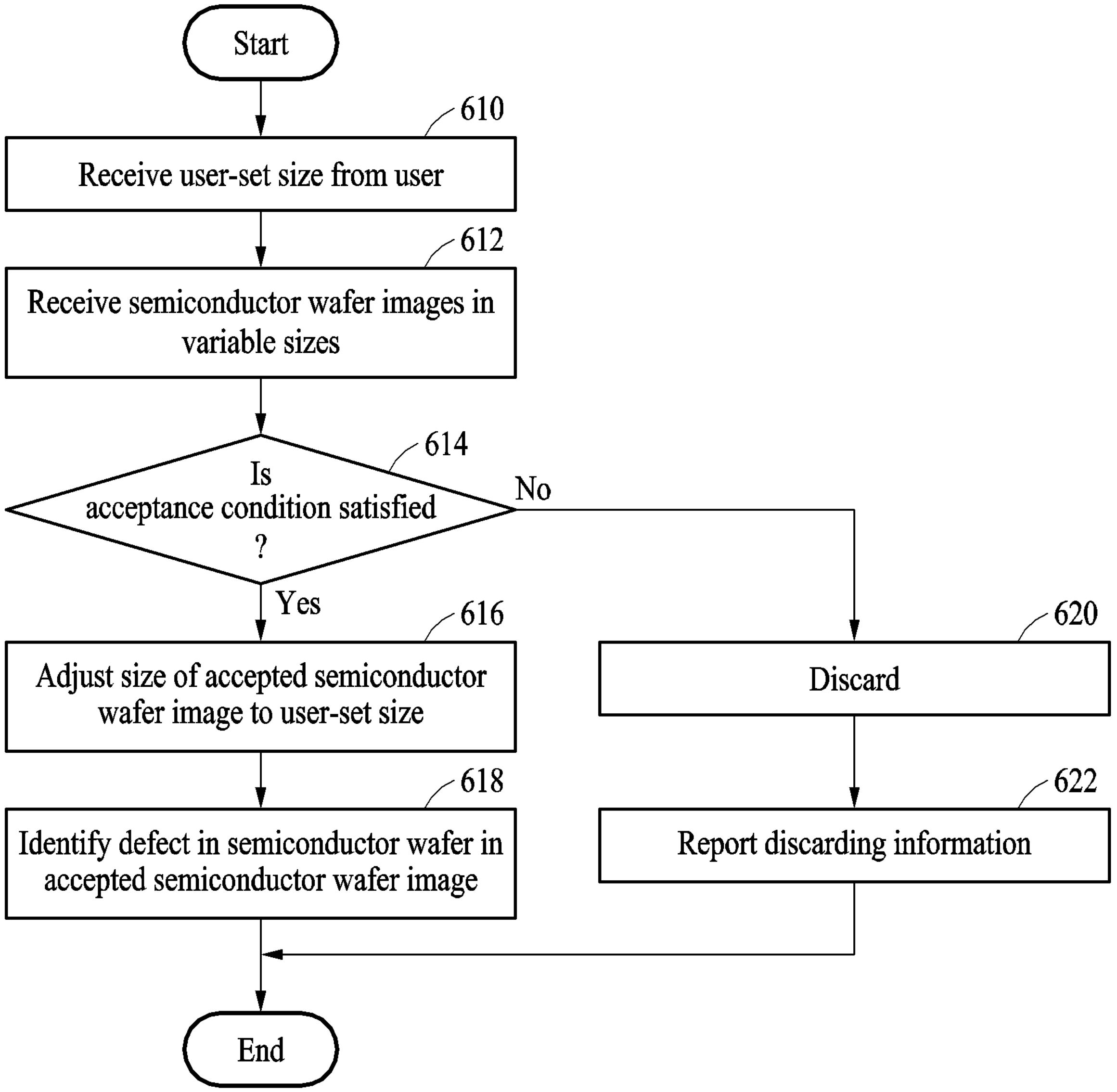
FIG. 6 illustrates an example of a process of identifying a defect in a semiconductor wafer according to a user-set operation mode in an electronic device, according to one or more embodiments.

FIG. 6 illustrates an example of a process of identifying a defect in a semiconductor wafer according to a user-set operation mode in an electronic device, according to one or more embodiments. In operation 610, the semiconductor wafer image processor 140 may receive a user-set size set according to a user input. In this case, the user may set an image size expected in a pipeline. In addition, an output and/or form of a semiconductor wafer image may be set by the user. In addition, the user may select a model to be used from among models in a repository. For example, a single shot detector (SSD) model may be selected.

Then, in operation 612, the semiconductor wafer image processor 140 may receive candidate semiconductor wafer images in variable sizes. In this case, a semiconductor wafer image in a variable size may have, for example, a form of 52×52 pixels or 26×26 pixels.

In operation 614, the semiconductor wafer image processor 140 may verify whether a candidate semiconductor wafer image satisfies a condition for accepting a semiconductor wafer image.

In operation 614, an acceptance condition may be for determining whether to accept a semiconductor wafer image (among the received semiconductor wafer images having variable sizes). The determining may be based on an aspect ratio and pixel range of the semiconductor wafer image. In this case, to ensure that the candidate image is a sufficiently high-quality image, the user may selectively use two filters to verify an aspect ratio and a pixel range, which may help with overall time and computational efficiency.

When the candidate semiconductor wafer image does not satisfy the acceptance condition after verification in operation 614, the semiconductor wafer image processor 140 may discard the candidate image in operation 620. In operation 622, discarding information may be provided to a user, for example.

When the candidate semiconductor wafer image satisfies the acceptance condition, in operation 616, the semiconductor wafer image processor 140 may adjust the size of the accepted candidate image to a user-set size, for example. In operation 616, the size of the accepted semiconductor wafer image may generally be adjusted using interpolation or other known resizing techniques.

In operation 618, the semiconductor wafer image processor 140 may determine whether there is a defect in the accepted semiconductor wafer image (and therefore in the corresponding semiconductor wafer) by using a defect prediction model.

Figure 7:
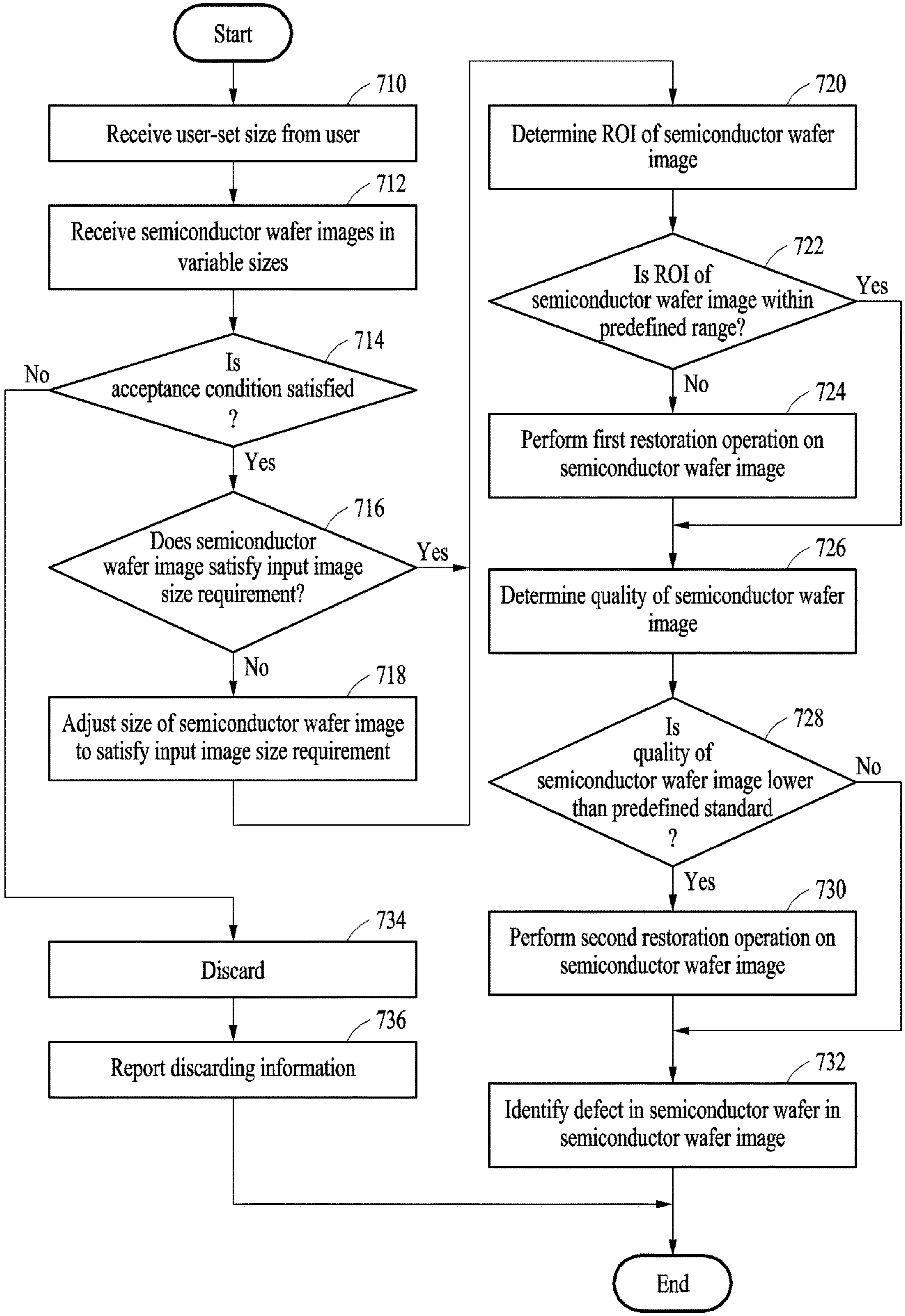
FIG. 7 illustrates an example of a process of identifying a defect in a semiconductor wafer according to an adaptive operation mode in an electronic device, according to one or more embodiments.

FIG. 7 illustrates an example of a process of identifying a defect in a semiconductor wafer according to an adaptive operation mode in an electronic device, according to one or more embodiments. In operation 710, the semiconductor wafer image processor 140 may receive a user-set size from a user.

In operation 712, the semiconductor wafer image processor 140 may receive candidate semiconductor wafer images having variable sizes. In this case, a semiconductor wafer image in a variable size may have, for example, a form of 52×52, 26×26, 42×44 pixels, or the like (in practice, images may be significantly larger).

In operation 714, the semiconductor wafer image processor 140 may verify whether a candidate semiconductor wafer image satisfies an acceptance condition. The acceptance condition may be, for example, an aspect ratio and pixel range.

When the candidate semiconductor wafer image does not satisfy the acceptance condition in operation 714, the semiconductor wafer image processor 140 may perform operation 734 which may involve discarding the candidate semiconductor wafer image, followed by operation 736 of providing discarding information on the discarded candidate semiconductor wafer image to a user, a log, etc.

In operation 716, the semiconductor wafer image processor 140 may verify whether the size of the accepted semiconductor wafer image satisfies a size requirement of a defect prediction model. The size requirement may be set by a user, for example.

When the size of the accepted semiconductor wafer image is verified as satisfying the image size requirement in operation 716, the semiconductor wafer image processor 140 may proceed with operation 720. When the size of the accepted semiconductor wafer image does not satisfy the input image size requirement after verification in operation 716, the semiconductor wafer image processor 140 may perform operation 718 and transform the accepted semiconductor wafer image to the required size in operation 718. In operation 718, the size of the accepted semiconductor wafer image may generally be transformed using interpolation, for example.

In operation 720, the semiconductor wafer image processor 140 may determine an ROI of the accepted semiconductor wafer image. After operation 720, in operation 722, the semiconductor wafer image processor 140 may verify whether the ROI of the accepted semiconductor wafer image is in a predefined range, for example.

When the ROI of the accepted semiconductor wafer image is within the predefined range after verification in operation 722, the semiconductor wafer image processor 140 may proceed to operation 726. However, when the ROI of the accepted semiconductor wafer image is not in the predefined range, the semiconductor wafer image processor 140 may proceed to operation 724 and perform a first restoration operation on the accepted semiconductor wafer image. For example, the first restoration operation may move the ROI of the accepted semiconductor wafer image such that the ROI of the accepted semiconductor wafer image is in the predefined range. This may involve any combination of image transforms that might cause the position of the ROI in the image to change, e.g., resizing and clipping in either or both dimensions, or the like.

In operation 726, the semiconductor wafer image processor 140 may determine a quality of the accepted semiconductor wafer image. When the quality of the accepted semiconductor wafer image satisfies a predefined standard the semiconductor wafer image processor 140 may proceed with operation 732. When the quality of the accepted semiconductor wafer image does not satisfy the predefined standard, in operation 730 the semiconductor wafer image processor 140 may perform a second restoration operation on the accepted semiconductor wafer image. The second restoration operation may increase the quality of the accepted semiconductor wafer image such that the quality of the accepted semiconductor wafer image satisfies the predefined standard. The type of quality standard and the corresponding second restoration operation may be any of those described above.

In operation 732, the semiconductor wafer image processor 140 may determine whether the accepted (and possibly restored) semiconductor wafer image (and by implication the corresponding semiconductor wafer) is defective using a defect prediction model. As described above, the defect prediction model may determine whether the image is defective, may identify one or more defects, etc. In addition to the accepted semiconductor wafer image, other information associated with the accepted image may be provided to the defect prediction model to inform the model's defect prediction for the accepted image. For example, such other information may be a scene graph of the accepted semiconductor wafer image, temperature information related to the accepted semiconductor wafer image, noise information on the accepted semiconductor wafer image, sensor data related to the accepted semiconductor wafer image, or other information (described above). Accordingly, in operation 730, the semiconductor wafer image processor 140 may provide such additional information to the defect prediction model.

Figure 8:
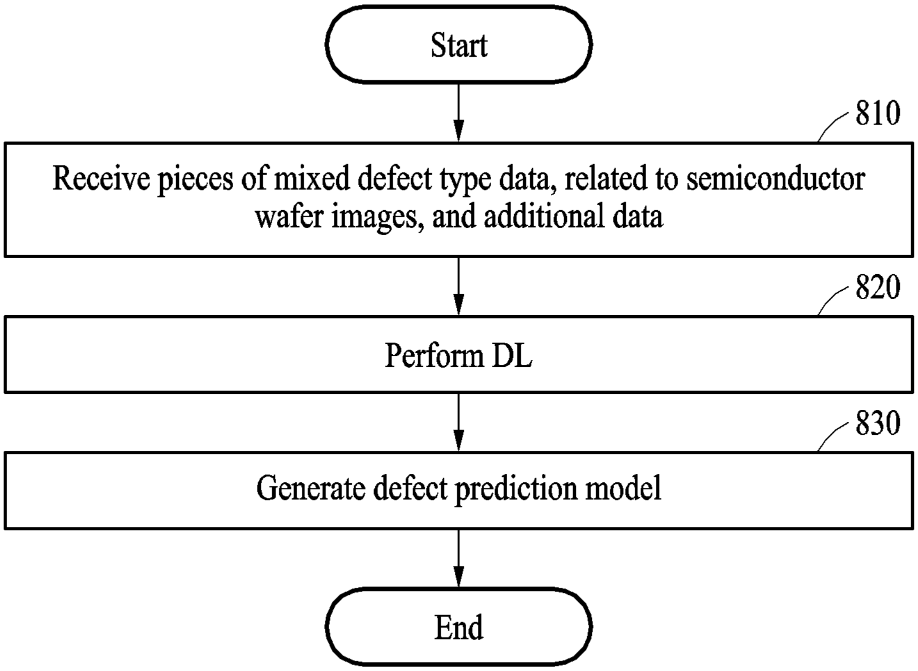
FIG. 8 illustrates an example of a process of generating a defect prediction model in an electronic device, according to one or more embodiments.

FIG. 8 illustrates an example of a process of generating a defect detection-related prediction model in an electronic device, according to one or more embodiments. In operation 810, the data driver 150 of the electronic device 100 may receive a plurality of pieces of mixed defect-type data related to a plurality of semiconductor wafer images and additional data. The additional data may be data used to develop/analyze the defect detection-related prediction model aside from training data.

In operation 820, the data driver 150 may generate (or re-train) the defect prediction model by performing DL using the pieces of mixed defect-type data and the additional data, if any. The pieces of mixed defect-type data may be as described above. The mixed defect-type data may include a balanced number of examples of the various defect types, which may enhance prediction accuracy of the defect prediction model. The additional data may also be used as described above to develop/analyze the defect prediction model. In operation 830, the data driver 150 may generate (e.g., re-train) the defect prediction model by using a result of the performed DL.

The computing apparatuses, the electronic devices, the processors, the memories, the image sensors, the displays, the information output system and hardware, the storage devices, and other apparatuses, devices, units, modules, and components described herein with respect to FIGS. 1-10 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A method performed by an electronic device, the method comprising:

determining, by the electronic device, an operation mode from among a plurality of different operation modes based on image characteristics of a candidate semiconductor wafer image of a plurality of semiconductor wafer images, where each of the operation modes includes a respective processing operation to be performed on the candidate semiconductor wafer image, selecting between the plurality of different operation modes at least one of determining of whether a region of interest (ROI) in a candidate semiconductor wafer image among a plurality of semiconductor wafer images is positioned in a predefined range, determining of whether a quality of the candidate semiconductor wafer image satisfies a predetermined standard, and the plurality of different operation modes enable the electronic device to adaptively preprocess the plurality of semiconductor wafer images based on image characteristics and reduces manual intervention in defect detection;

implementing, by the electronic device, the determined operation mode by performing the respective processing operation of the determined operation mode on the candidate semiconductor wafer image; and in response to a result of performing the respective processing operation, determining, by the electronic device, whether a semiconductor wafer captured in the candidate semiconductor wafer image includes at least one defect by implementing a defect prediction machine learning model to predict a wafer defect in the candidate semiconductor wafer image so that a reliability of a prediction of a semiconductor wafer defect in the semiconductor wafer images is improved and resource overhead is minimized.

2. The method of claim 1, further comprising:

based on the determined operation mode, preventing another of the semiconductor wafer images from being processed to determine whether the other semiconductor wafer image is defective based on at least one of an aspect ratio of the other semiconductor wafer image, a size of the other semiconductor wafer image, or an image quality of the other semiconductor wafer image.

3. The method of claim 1, further comprising:

based on the determined operation mode, preventing another of the semiconductor wafer images from being processed to determine whether the other semiconductor wafer image is defective based on whether a region of interest (ROI) is found in the other semiconductor wafer image or whether a position of the ROI in the other semiconductor wafer image meets a ROI condition.

4. The method of claim 1, wherein the performing of the respective processing operation of the determined operation mode includes:

based on at least one of an aspect ratio, a size, or an image quality of the candidate semiconductor wafer image being determined to not satisfy a preset image quality standard, restoring the candidate semiconductor wafer image to satisfy the preset image quality standard.

5. The method of claim 4, wherein the plurality of semiconductor wafer images have a same preset size.

6. The method of claim 1, wherein the semiconductor wafer images have various sizes, and wherein the performing of the respective processing operation of the determined operation mode includes:

determining to accept the candidate semiconductor wafer image based on an aspect ratio and pixel range of the candidate semiconductor wafer image; and resizing the candidate semiconductor wafer image in response to the candidate semiconductor wafer image being accepted.

7. The method of claim 6, wherein the size is determined according to a user input.

8. The method of claim 1, wherein the method further comprises:

receiving a user-set size requirement of the defect prediction machine learning model from a user, wherein the performing of the respective processing operation of the determined operation mode includes:

performing a first determining of whether the candidate semiconductor wafer image satisfies the size requirement;

based on a result of the first determining being that the size requirement is not satisfied, generate a resized candidate semiconductor wafer image by resizing the candidate semiconductor wafer image to satisfy the size requirement;

in response to a result of the determining of whether the ROI in the candidate semiconductor wafer image is positioned in the predefined range being that the ROI is not positioned in the predefined range in the candidate semiconductor wafer image, generate a first restored candidate semiconductor wafer image by performing a first restoration operation on the resized candidate semiconductor wafer image; and based on a result of a performed determining of whether the quality of the candidate semiconductor wafer image satisfies the predetermined standard being that the quality does not satisfy the predetermined standard, generate a second restored candidate semiconductor wafer image by performing a second restoration operation on the first restored candidate semiconductor wafer image, and wherein the second restored candidate semiconductor wafer image is generated from the resizing, the first restoration operation, and the second restoration operation.

9. The method of claim 8, wherein the first restoration operation comprises transforming the resized candidate semiconductor wafer image such that the ROI in the resized candidate semiconductor image is moved to be positioned in the predefined range, and wherein the second restoration operation comprises increasing the quality of the first restored candidate semiconductor wafer image such that a quality of the second restored candidate semiconductor wafer image satisfies the predefined standard.

10. The method of claim 8, wherein the plurality of semiconductor wafer images have various sizes.

11. The method of claim 1, wherein the defect prediction machine learning model performs the prediction of the wafer defect based on at least one of a scene graph of the candidate semiconductor wafer image, temperature information related to the candidate semiconductor wafer image, noise information on the candidate semiconductor wafer image, or sensor data related to the candidate semiconductor wafer image.

12. The method of claim 1, further comprising determining the operation mode from among the operation modes based on evaluating:

whether sizes of the plurality of the semiconductor wafer images are in a same preset size;

whether sizes of the plurality of the semiconductor wafer images are different from a user-set size; and whether the plurality of the semiconductor wafer images have variable sizes.

13. The method of claim 1, wherein the performing of the respective processing operation of the determined operation mode includes selectively resizing the candidate semiconductor wafer image or selectively restoring the candidate semiconductor wafer image to move a region of interest (ROI) within the candidate semiconductor wafer image.

14. The method of claim 1, wherein the determining of the operation mode includes determining the operation mode from among the different operation modes based on a consideration of respective information of multiple of the plurality of semiconductor wafer images.

15. An electronic device comprising:

at least one processor configured to receive semiconductor wafer images;

a memory storing instructions that, when executed by the at least one processor, configure the at least one processor to:

determine an operation mode from among a plurality of different operation modes based on image characteristic of a candidate semiconductor wafer image of a plurality of semiconductor wafer images, where each of the operation modes includes a respective processing operation to be performed on the candidate semiconductor wafer image, selecting between the plurality of different operation modes at least one of determining of whether a region of interest (ROI) in a candidate semiconductor wafer image among a plurality of semiconductor wafer images is positioned in a predefined range and determining of whether a quality of the candidate semiconductor wafer image satisfies a predetermined quality standard, and the plurality of different operation modes enable the electronic device to adaptively preprocess the plurality of semiconductor wafer images based on image characteristics and reduces manual intervention in defect detection;

implement the determined operation mode through performance of the respective processing operation of the determined operation mode on the candidate semiconductor wafer image; and in response to a semiconductor wafer image result of the performed respective processing operation, determine whether a semiconductor wafer captured in the candidate semiconductor wafer image includes at least one defect by implementing a defect prediction machine learning model to predict a wafer defect in the candidate semiconductor wafer image so that a reliability of a prediction of a semiconductor wafer defect in the semiconductor wafer images is improved while minimizing resource overhead.

16. The electronic device of claim 15, wherein the execution of the instructions further configures the at least one processor to, based on the determined operation mode:

not accept the candidate semiconductor wafer image for determining whether the semiconductor wafer in the candidate semiconductor wafer image is defective based on at least one of an aspect ratio, a size, a quality of, and lack of a region of interest (ROI) of the candidate semiconductor wafer image.

17. The electronic device of claim 15, wherein the execution of the instructions further configures the at least one processor to:

train the defect prediction machine learning model to predict types of wafer defects, and wherein the predicted wafer defect is one at least one of the types of wafer defects.

18. The electronic device of claim 15, wherein all the plurality of semiconductor wafer images all have a same preset size, and wherein, for the performance of the respective processing operation of the determined operation mode, the execution of the instructions further configures the at least one processor to, based on a quality of the candidate semiconductor wafer image being determined to not satisfy the predetermined quality standard, restore the candidate semiconductor wafer image to satisfy the predetermined quality standard as the respective processing operation of the determined operation mode.

19. The electronic device of claim 15, wherein the plurality of semiconductor wafer images have various sizes, and wherein, for the performance of the respective processing operation of the determined operation mode, the execution of the instructions configures the at least one processor to determine, based on an aspect ratio and pixel range of the candidate semiconductor wafer image, whether to accept the candidate semiconductor wafer image, and resize the candidate semiconductor wafer image in response to the candidate semiconductor wafer image being accepted and as the respective processing operation of the determined operation mode.

20. The electronic device of claim 15, wherein the plurality of semiconductor wafer images have various sizes, and wherein, for the performance of the respective processing operation of the determined operation mode, the execution of the instructions configures the at least one processor to determine, based on an aspect ratio and pixel range of the candidate semiconductor wafer image, whether to accept the candidate semiconductor wafer image, and resize the candidate semiconductor wafer image to a preset size in response to the candidate semiconductor wafer image being accepted and as the respective processing operation of the determined operation mode.

21. The electronic device of claim 15, wherein the plurality of semiconductor wafer images have various sizes, and wherein, for the performance of the respective processing operation of the determined operation mode, the execution of the instructions configures the at least one processor to:

based on a determining that the candidate semiconductor wafer image does not satisfy a received user-set input size requirement of the defect prediction machine learning model, resize the candidate semiconductor wafer image such that a size of the resized candidate semiconductor wafer image satisfies the size requirement;

based on a determining that an ROI in the candidate semiconductor wafer image is not positioned in a predefined range in the candidate semiconductor wafer image, generate a first restored candidate semiconductor wafer image by performing a first restoration operation on the resized candidate semiconductor wafer image; and based on a determining that a quality of the candidate semiconductor wafer image does not satisfy a predefined standard, generate a second restored candidate semiconductor wafer image by performing a second restoration operation on the first restored candidate semiconductor wafer image, and wherein the second restored semiconductor wafer image results from the resizing, the first restoration operation, and the second restoration operation.

22. The electronic device of claim 21, wherein the first restoration operation moves the ROI in the resized candidate semiconductor wafer image such that the ROI in the resized candidate semiconductor wafer image is in the predefined range, and wherein the second restoration operation increases the quality of the first restored candidate semiconductor wafer image such that a quality of the second restored semiconductor wafer image satisfies the predefined standard.

23. The electronic device of claim 15, wherein the defect prediction machine learning model performs the prediction of the wafer defect based on at least one of a scene graph of the candidate semiconductor wafer image, temperature information related to the candidate semiconductor wafer image, noise information on the candidate semiconductor wafer image, and sensor data related to the candidate semiconductor wafer image.

24. The electronic device of claim 15, wherein the execution of the instructions further configures the at least one processor to:

determine the operation mode based on evaluating:

whether the plurality of semiconductor wafer images have a same preset size;

whether the plurality of semiconductor wafer images have sizes different from a user-set size; and whether the plurality of semiconductor wafer images have varying sizes.

* * * * *